US008041882B2

(12) United States Patent
Jachalsky et al.

(10) Patent No.: US 8,041,882 B2
(45) Date of Patent: Oct. 18, 2011

(54) METHOD AND DEVICE FOR WRITING TO A FLASH MEMORY

(75) Inventors: Joern Jachalsky, Hannover (DE); Marko Luetjen, Hannover (DE)

(73) Assignee: Thomson Licensing, Boulogne-Billancourt (FR)

( * ) Notice: Subject to any disclaimer, the term of this patent is extended or adjusted under 35 U.S.C. 154(b) by 480 days.

(21) Appl. No.: 11/784,817

(22) Filed: Apr. 10, 2007

(65) Prior Publication Data

US 2007/0255892 A1     Nov. 1, 2007

(30) Foreign Application Priority Data

Apr. 28, 2006   (EP) ..................................... 06113281

(51) Int. Cl.
*G06F 12/00*          (2006.01)
(52) U.S. Cl. ................. 711/103; 711/E12.008
(58) Field of Classification Search .................. 711/103; 365/185, 189
See application file for complete search history.

(56) References Cited

U.S. PATENT DOCUMENTS

| 5,822,245 | A | * | 10/1998 | Gupta et al. | 365/185.12 |
| 6,145,050 | A | * | 11/2000 | Kaki et al. | 711/103 |
| 6,728,826 | B2 | * | 4/2004 | Kaki et al. | 711/103 |
| 7,042,770 | B2 | * | 5/2006 | Lee et al. | 365/189.05 |
| 7,243,185 | B2 | * | 7/2007 | See et al. | 711/103 |
| 2003/0117850 | A1 | * | 6/2003 | Yano | 365/185.17 |
| 2004/0141402 | A1 | | 7/2004 | Kim | |
| 2005/0055481 | A1 | * | 3/2005 | Chou et al. | 710/52 |
| 2006/0133145 | A1 | * | 6/2006 | Park et al. | 365/185.12 |
| 2008/0250202 | A1 | * | 10/2008 | Conley et al. | 711/115 |

OTHER PUBLICATIONS

European Search Report.

* cited by examiner

*Primary Examiner* — Hetul Patel
*Assistant Examiner* — John P Fishburn
(74) *Attorney, Agent, or Firm* — Robert D. Shedd; Jeffrey M. Navon

(57) ABSTRACT

For NAND flash devices, two specific bounds for the program time are defined in the data sheets: a typical program time, during which more than 50% of all pages are programmed, and a maximum program time. Reduction of the maximum program time to an effective program time is possible using the following method for writing to a flash memory, comprising the steps of specifying an effective program time that is between typical and maximum program time, writing first data to the flash memory, after the effective program time checking if the programming cycle is finished, if it is finished writing second data to the flash memory, and if it is not finished writing the at least second data to a buffer memory and marking them as not to be overwritten, repeating the previous steps as long as further data are to be stored, determining a free location in a flash memory, and copying the at least second data from the buffer memory to the determined location in the flash memory.

12 Claims, 3 Drawing Sheets

METHOD AND DEVICE FOR WRITING TO A FLASH MEMORY

This application claims the benefit, under 35 U.S.C. §119 of European Patent Application 06113281.7, filed Apr. 28, 2006.

FIELD OF THE INVENTION

This invention relates to a method and a device for writing to a flash memory.

BACKGROUND

Flash technology is widely used e.g. in memory cards, USB drives, MP3 players, and as image storage for digital still cameras. Flash memories are usually based on NAND or on NOR structures. NAND is best suited for flash devices that require high capacity data storage. NAND flash devices usually contain a data register that holds the data e.g. during the so-called programming process, wherein the data are actually written into the flash memory cells.

NAND flash devices usually contain so-called bad blocks or pages, i.e. pages that contain one or more bits that may store no information due to defects and therefore are unusable. Further, NAND flash memories are subject to wear-out, meaning that gradually more and more blocks turn bad. For this and other reasons, blocks may be in a phase where storing data to them is not always successful. For the common NAND flash devices, two specific bounds for the program time are defined in the data sheets: a typical program time and a maximum program time. The typical program time is defined as the time within which more than 50% of all pages are programmed (at a specified voltage level and temperature). Consequently, more than 50% of all page program processes are performed in a time for which the typical program time is the upper bound. For the remaining pages, the maximum program time is the upper bound. E.g. for today's Micron NAND flash devices a typical program time is specified to 300 μs, whereas the maximum program time is specified to 700 μs.

It is the responsibility of the applications that use NAND flash to keep track of such bad blocks. However, good blocks can typically be erased and re-programmed more than 100,000 to 1,000,000 times. The devices programming time decreases slightly with increasing number of write/erase cycles, and the end of life of a device is usually determined by other failures than program failures.

The different typical and maximum program times mentioned above are due to the employed program-verify strategy. This means that multiple attempts to program the data bits are done and verified, until the program process is successful or a time out occurs. This program-verify process is automatically executed by internal control logic.

NAND flash memory has an inherent, non-negligible latency due to the program time that is required to program one page from the data register into the NAND flash cell array. However, the program time for a successful page program process is not fully deterministic, but times are distributed within a range, with the maximum program time as upper bound. Thus, for applications that require data to be stored continuously, the maximum program time determines the effective data rate that can be achieved.

More information on NAND flash technology is available from the "NAND Flash Design Guide" by Toshiba, accessible under www.data-io.com/pdf/NAND/Toshiba/NandDesign-Guide.pdf.pdf.

SUMMARY OF THE INVENTION

A problem to be solved by the present invention is to provide a method and structure for reducing the effective program time of flash devices.

Another problem to be solved is to provide a method and structure for storing a continuous data stream in flash devices, wherein the data rate to be stored is higher than the data rate that results from the maximum program time of the employed flash devices, and wherein the program-verify process within the flash devices is not disturbed.

The present invention utilizes the fact that only very few memory blocks really require the specified maximum program time, and provides a method and structure for handling these cases such that the data to be stored are not lost. According to the invention, these data are stored in a buffer memory, and are later copied into a flash memory device. It is assumed here that sufficient flash memory space is available for the data to be stored. In particular when selecting an effective program time that is clearly above (e.g. 10%) the typical program time, but closer to the typical program time than to the maximum program time, then the probability for program failures is low enough for keeping the data for which the program process failed in a buffer memory, and copying it later to a flash memory.

According to one aspect of the invention, a method for writing to a flash memory that has a specified maximum program time and a specified typical program time and provides one or more signals indicating if a programming cycle is finished comprises the steps of specifying an effective program time that is above typical program time and below maximum program time, writing first data to a first location in the flash memory, after the specified effective program time, evaluating said one or more signals indicating if the programming cycle is finished, if the programming cycle is finished, writing second data to a second location in the flash memory, if the programming cycle is not finished, writing the at least second data to a buffer memory and marking the at least second data in the buffer memory not to be overwritten, if further data are to be stored, repeating the previous steps starting from the step of writing the data to the flash memory, determining a free location in the flash memory, and copying the at least second data from the buffer to the determined location in the flash memory, wherein the data may be erased from the buffer.

According to one aspect of the invention, a device for writing to a flash memory, wherein the flash memory has a specified maximum program time and a specified typical program time and provides one or more signals (e.g. Status Read, Busy) indicating if a programming cycle is finished, comprises means for specifying an effective program time that is above typical program time and below maximum program time, means for writing first data to a first location in the flash memory, means for evaluating after the specified effective program time said one or more signals indicating if the programming cycle is finished, means for writing of second data to a second location in the flash memory, wherein the second data are only written into the flash memory if the previous programming cycle was finished, a buffer memory (e.g. a page buffer sufficient for a plurality of pages), means for writing the at least second data to the buffer memory, means for marking the at least second data in the buffer memory as not to be overwritten if the previous programming cycle was not finished, means for determining a free location in the flash memory (this may be e.g. a table showing reserved blocks), and means for copying the at least second data from the buffer memory to the determined location in the flash memory, wherein the data may be erased from the buffer memory.

In one embodiment, means for determining that no further data are to be stored may be employed.

In a preferred embodiment, the flash memory is a NAND flash memory.

In one embodiment, the size of the buffer memory is equal to or above the total amount of data for which the flash programming process is expected to exceed the effective program time. In one embodiment, the size of the buffer memory is equal to or above the total amount of data for which the flash programming process is expected to exceed the effective program time plus the expected amount of data for which the flash programming process will (according to normal behavior of the flash memory) not be successful.

In one embodiment, the buffer memory is also used for storing data for which the flash programming process was not successful.

Exemplarily the effective program time is substantially 50% of the specified maximum program time.

The invention can also be understood as a method and device for coping with program time errors in flash devices that are accessed too fast.

Advantageous embodiments of the invention are disclosed in the dependent claims, the following description and the figures.

BRIEF DESCRIPTION OF THE DRAWINGS

Exemplary embodiments of the invention are described with reference to the accompanying drawings, which show in FIG. 1 the structure of a NAND flash array with an additional page buffer.

DETAILED DESCRIPTION OF THE INVENTION

Figure 1:
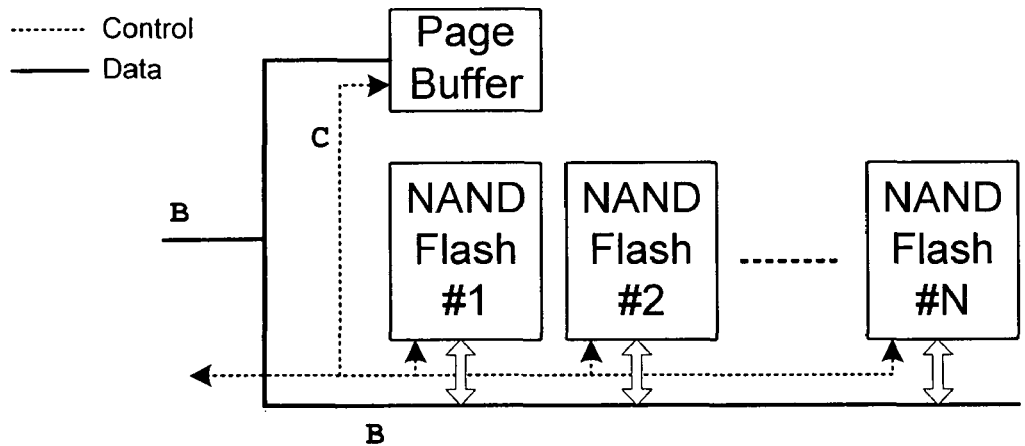

FIG. 1 shows the structure of a circuitry with N NAND flash devices and a page buffer, which can be used for storage of continuous real-time data streams. The data are written sequentially in pages (and each page bytewise sequentially) into the flash devices, using a common I/O address and data bus B and control signals C, e.g. for separate chip enable of the flash devices. The data may also be written into the page buffer, which is connected (logically) parallel to the flash devices. The flash devices are operated using a program time that is shorter than the specified maximum program time, which leads to the occurrence of occasional program time exceeding. According to the invention, at least the data following those that experience such program time exceeding are stored in the page buffer, and are later copied into remaining free locations of the flash memory.

FIG. 1 and further figures are simplified with respect to parallel connections. The skilled person knows that flash devices may not simply be connected in parallel, and that the same holds for buffer memories. Thus, the depicted structures are to be understood as logical structures.

In one embodiment of the invention all data, which are during normal operation written into the flash memories, are also written into the page buffer. When the program process was finished successfully, these data in the page buffer are overwritten or deleted.

In another embodiment only those data are written into the page buffer that were not stored in a flash memory, i.e. only those data that follow data for which the flash memory could not finish the internal program-verify process within the specified effective program time (which is shorter than the specified maximum program time of the flash devices).

Figure 2:
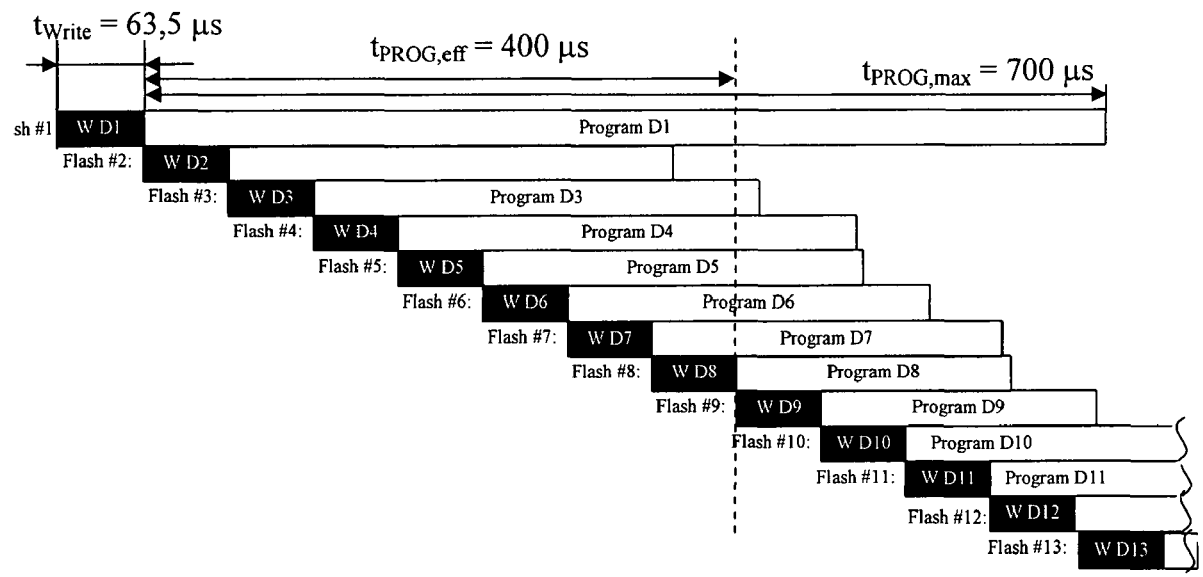
FIG. 2 a simplified logical access pattern to flash devices.

FIG. 2 shows exemplarily (in a simplified, logical manner) for a number of devices sequential continuous writing of a data stream, where each flash device requires a write time $t_{Write}$ and a program time. This architecture implicitly assumes that the logical data word width or "band width" of a single flash device is at least the amount of data that has to be stored during the write time, in this example 63,5 μs. While the write time $t_{Write}$ for storing a data block in the data register internal to the flash device is constant and equal for all devices of the same type, the program time for storing the data from the data register into a flash memory cell differs for each device Flash#1,...,#13. Moreover, for each particular device the program time differs for each (write) access in a non-deterministic manner. E.g. although the program time for a particular write access for Flash#1 reaches the maximum allowed program time $t_{PROG,max}$ as depicted, the next write access may (and most probably will) take much less time, since a much shorter typical program time (e.g. 300 μs) is guaranteed by the device manufacturer.

Thus, conventional systems for continuous data storage are designed such that for a particular flash device the time between successive write accesses is equal or more than the specified maximum program time $t_{PROG,max}$, so that in the (not properly scaled) example shown in FIG. 2 thirteen flash devices are required (ie. twelve devices to bridge the max. program time of each single flash: 700/63,5=11,02).

The invention uses a reduced program time, which is called effective program time $t_{PROG,eff}$ herein, of e.g. 400 μs. Though any device may require more than the effective program time, up to the maximum program time, the probability for this case is low enough for storing all affected pages in the page buffer (which has the size of normal, commercially available devices) until the data stream to be 'stored is finished, and then transferring the buffered data into remaining locations of the flash memory array.

Figure 3:
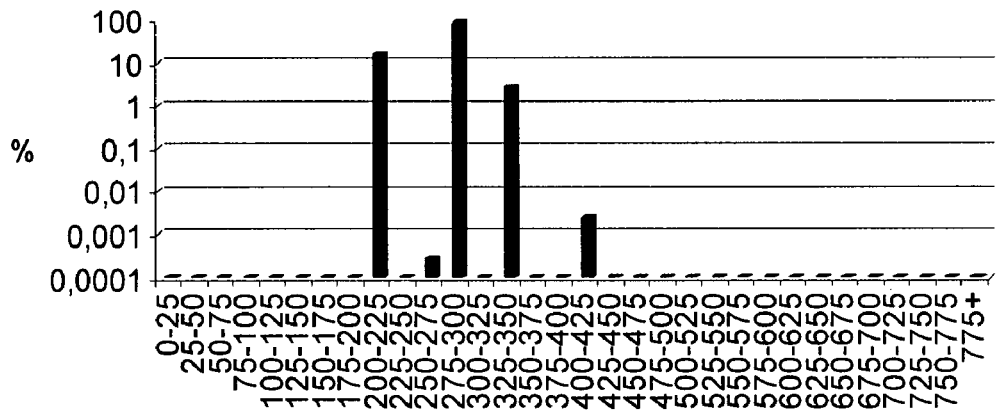
FIG. 3 an exemplary program time distribution of a single MICRON flash device.

FIG. 3 shows an exemplary program time distribution (in logarithmic scale) of a single MICRON flash device, for which a typical program time of 300 μs and a maximum program time of 700 μs is specified. As can be seen, only few (2-3%) of the program processes exceed the typical program time of 300 μs. This is a common statistical effect, based on the fact that this is a random sample, while the value is specified for all devices and a large range of operating parameters. However, it has been observed that unexpectedly only very few program processes (<0.002%) exceed a program time of 350 μs, and even considerably less exceed a program time of 425 μs. This behavior applies in principle to all NAND flash device types, also from other manufacturers. However, it is possible that program times of $t_{PROG,max}$ occur.

Figure 4:
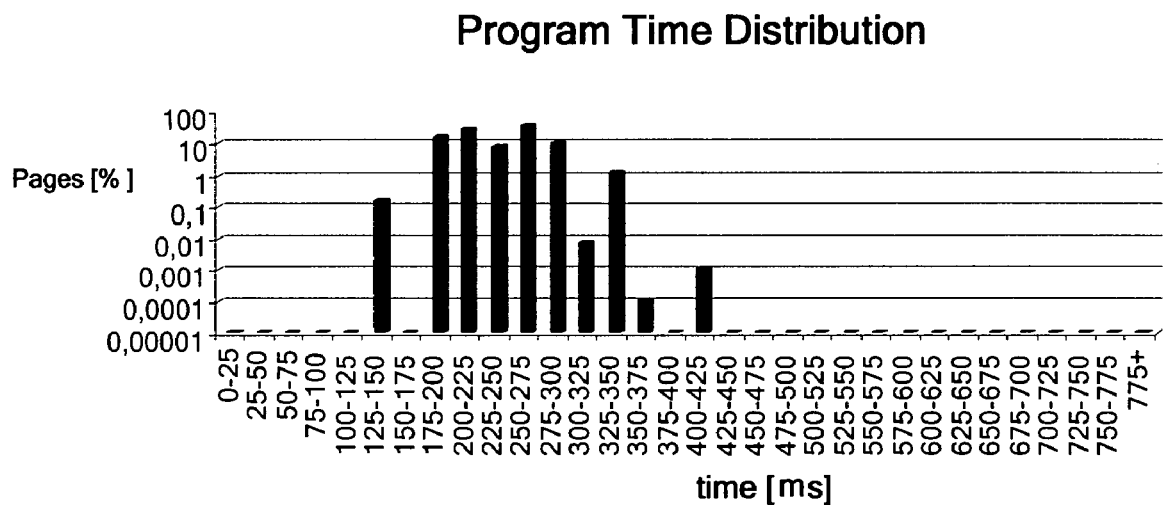
FIG. 4 an exemplary program time distribution of a group of arbitrary MICRON flash devices of same type.

When considering a higher number of samples, a distribution as shown in FIG. 4 is obtained, which basically corresponds to the behavior of the single device. The probability for a page to exceed a program time of 350 µs, which is only half of the maximum program time, is only around $1.3*10^{-3}$% or $1.3*10^{-5}$. Thus, the amount of data that will not be stored is so low that it can be buffered in a page buffer, which is connected (logically) parallel to the flash devices. E.g. in a 1 GB data stream the amount of data to be buffered would be 13 KB.

Figure 5:
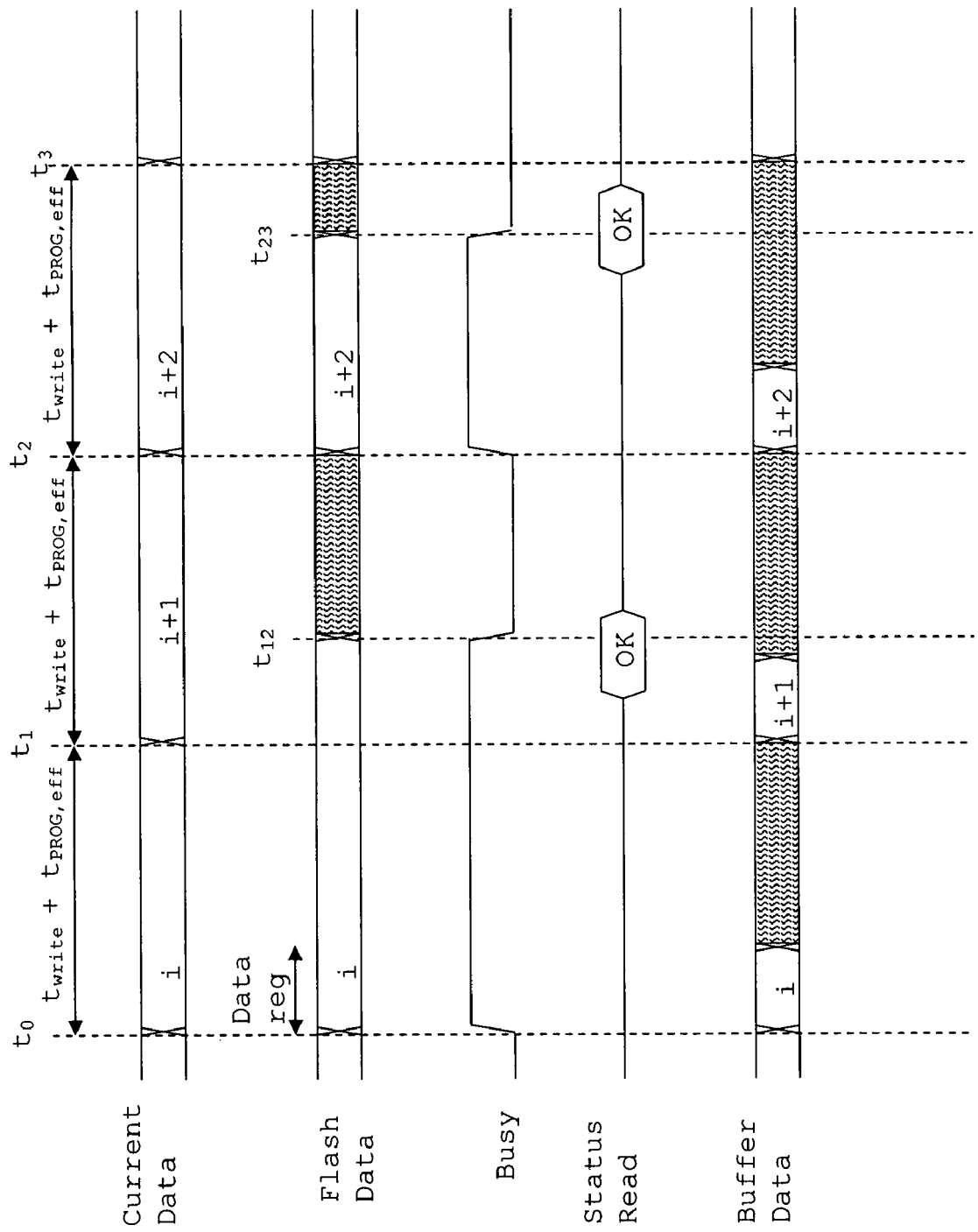
FIG. 5 a timing diagram showing flash device access and buffer access.

FIG. 5 shows in a simplified logical manner access to flash devices and to a page buffer according to the invention in a timing diagram. At any point $t_0$ in time, a data page i is to be stored as current data. A flash device is selected and enabled to store these data i (note that in reality the data are not continuously applied). It provides status signals, which are in a simplified logical manner given as "Busy" with possible values "high/true" and "low/false", and "Status Read" with one possible value of "OK" and other values being "not OK". At $t_0$ the flash device indicates through its status signal that it is busy with storing the current data i. Actually, the flash performs this storage in two steps, as mentioned above, namely storing the data first in the data register and then in the actual flash memory cells. This is not shown in detail. Simultaneously, the data i are also stored as "Buffer Data" in a page buffer.

In other embodiments, buffering of these data at this point in time $t_o$ is not performed. An effective program time $t_{PROG,eff}$ which is below the maximum program time $t_{PROG,max}$ is specified for the flash devices, and after this time (plus the data register write time) has elapsed at $t_1$, the next data i+1 arrive and must be stored. Usually, the previous storage (ie. program) process is at this time $t_1$ finished, so that the flash may continue with storing the new data i+1. However, FIG. 5 shows the critical case in which the flash device needs longer than the effective program time.

Therefore the device is still busy at $t_1$ when the next data arrives. However, according to the invention the new data i+1 are written into the page buffer, which is much faster than the flash memory. In principle, writing to a page buffer takes not longer than writing to the data register within the flash device. Note that the write time $t_{Write}$ is different from the write cycle time $t_{WriteCyc}$ that is usually specified for flash devices: $t_{Write}=n \cdot t_{WriteCyc}$ with n≈2 kbyte.

At this point in time $t_1$, it is clear that the new data i+1 that were written into the page buffer will not immediately be stored in the flash memory, and therefore these data are marked such that they must be stored in the buffer until there is sufficient time for copying them from the page buffer to a flash memory. This may be the same or another flash memory. The mark comprises a sequence, position or time information for the buffered pages for which flash programming failed. This information is preferably stored in the respective controller, which controls the access to the flash devices and the buffer, but it may also be stored within the buffer.

In the presently described embodiment, the new data page i+1 is not further considered for storage during the current cycle of $t_{PROG,eff}$. After the page has been buffered, the controller skips further attempts to store it into the flash memory. During the present cycle (assuming that $t_{PROG,eff} \geq t_{PROG,max}/2$) the status signals of the flash memory indicate at $t_{1,2}$ that the previous data page has been successfully stored.

In another embodiment, it would be possible to continue with storing the buffered data page i+1. This is however difficult due to the I/O bus being busy with data for other devices.

When the next data page i+2 is due for this flash device at $t_2$, the data can be stored as described before, because the maximum program time of the previously stored data page i is over (assuming that $t_{PROG,eff} \geq t_{PROG,max}/2$). If a shorter effective program time would be used, the maximum program time would not yet be over at $t_2$ and thus the next page i+2 would have to be handled in the same way as the previous page i+1, i.e. it would also have to be buffered.

In one embodiment, the page buffer stores those data pages for which flash programming exceeded $t_{PROG,eff}$ in the following manner (in principle):

TABLE 1

Exemplary page buffer usage (in principle)

| # | Buffer page#0 | Buffer page#1 | Buffer page#2 | Buff.page#3 |
|---|---|---|---|---|
| 1 | current page j | | | |
| 2 | current page j + 1 | | | |
| 3 | current page j + 1 | failed page j + 2 | | |
| 4 | current page j + 3 | failed page j + 2 | | |
| 5 | current page j + 4 | failed page j + 2 | | |
| 6 | current page j + 5 | failed page j + 2 | | |
| 7 | current page j + 5 | failed page j + 2 | failed page j + 6 | |
| 8 | current page j + 7 | failed page j + 2 | failed page j + 6 | |
| 9 | current page j + 8 | failed page j + 2 | failed page j + 6 | |
| ... | | | | |
| M | last page M − 1 | failed page j + 2 | failed page j + 6 | |

Tab.1 shows a simple exemplary usage of the page buffer. Each line represents the status of the page buffer after a time of $t_{Write}+t_{PROG,eff}$. A first buffer page is used for buffering the current data page, i.e. the data page that is also currently stored to a flash memory. If the flash programming process was not successful at the time when the next data page (current page j+1 in Tab.1) must be stored, this data page is buffered in the next higher buffer page (Buffer page #1). Assuming that $t_{PROG,eff} \geq t_{PROG,max}/2$, the maximum programming time has passed when the next data page (j+3) must be stored, so that this next data page (j+3) can reuse the first buffer page (page#0). Following data pages are also stored in this buffer page (page#0), until the next failure occurs.

In Tab.1, the data page j+5 has not been successfully stored in the page buffer when the next data page j+6 arrives, so that the flash memory indicates through its status signals that it is still busy with the previous data page j+5. Then the buffer controller causes the next data page j+6 to be buffered in the next free buffer page, which is Buffer page #2 in this example. Further following data pages may again be stored in the first buffer page page#0, as described above.

Finally, after the last data page M-1 has been stored in the flash, the buffer contains on the pages following the "current data" page all data pages that were not yet stored in the flash, because their respective previous pages exceeded the effective program time. These may then be copied into the flash memory. The above-mentioned position, sequence or time information of these pages is required for reconstructing the data stream, and may therefore also be stored in a flash.

The described procedure does not consider data pages for which flash storage failed completely due to bad blocks. These pages may also be stored in the page buffer, and the process for storing them may be superposed to the described process. In that case e.g. the current buffer page will not be overwritten after a program failure, and the page buffer will eventually contain all data pages that were—for different reasons—not stored in the flash memory.

As mentioned above, in one embodiment the page buffer holds only those data pages that could not be written into the flash memory. In other embodiments, the page buffer may additionally hold the current page or pages, whose number may depend on the ratio $t_{PROG,max}/t_{PROG,eff}$. FIG. 5 shows the case of $t_{PROG,max}/2 \leq t_{PROG,eff} < t_{PROG,max}$.

E.g. for the case of $t_{PROG,max}/3 \leq t_{PROG,eff} < t_{PROG,max}/2$, at least two successive data pages must be stored instead of only one. Similarly, for $t_{PROG,max}/4 \leq t_{PROG,eff} < t_{PROG,max}/3$, at least three successive data pages must be stored. However, for higher ratios the probability of program process failures is too high, assuming today's flash devices and page buffer sizes. Thus, from today's point of view, useful configurations for this embodiment are page buffers that buffer 1-3 pages per page that exceeds $t_{PROG,eff}$.

The invention helps to effectively reduce the program time of NAND Flash devices even for applications with real-time constraints. This leads to a higher guaranteed data rate for a single NAND Flash device. With regard to scaling in terms of data rate fewer NAND Flash devices are required to achieve a certain, guaranteed data rate.

With regard to scaling in terms of data rate, the invention allows providing a guaranteed input data rate with fewer NAND Flash devices than conventional prior art, or a higher guaranteed data rate than conventional prior art with a given number of NAND Flash devices.

Using measurements, the performance of current NAND Flash devices was evaluated and the actual distribution of the program time was determined. These measurements showed that e.g. for Micron NAND Flash devices (with 300/700 µs typ./max.program time) only $1.3*10^{-3}\%$ of all page programs exceed a program time of 350 µs, which is only half of the maximum program time. From the measurements the conclusion can be drawn that it is reasonable and technically feasible to effectively reduce the effective program time; even a reduction to half the maximum program time is feasible.

In the following the invention is explained for the case that the maximum program time of 700 µs is reduced to an effective program time of 350 µs. However, the invention is not restricted to this particular ratio. With this ratio, the data rate can be increased by approximately 80% e.g. for MICRON flash devices. Further, it is assumed in the following that the page buffer is also used to store pages for which flash storage failed completely due to bad blocks.

For applications that require a guaranteed data rate (e.g. for storage of real-time data streams), it is in general necessary to store the data pages in the NAND flash devices in a fixed time interval. The interval to start the storage of a new (the next) page into the same NAND flash again is determined by the program time plus the time for setup and addressing and the time required to input one page into the data register. With Status Read operations it can be checked whether a page program operation is still ongoing or has been successfully completed. To allow the handling of not successful page programs (in case of e.g. new bad blocks) one strategy is to simultaneously store the page, which is input into the data register of the currently selected NAND flash, also in a page buffer. When Status Read indicates that the page program was successful, the page can be deleted from the page buffer, or overwritten by another page. If the page program was not successful, the page is kept in the page buffer until the storage of the stream is completed. Then, it is stored in a NAND flash device that has free storage capacity left. To maintain the correct order of the pages, the address locations of subsequent pages has to be memorized. This can be done in a separate unit, or in the controller unit which controls also the access to the different flash devices.

With the reduction of the maximum program time to an effective program time, those cases in which the program time is exceeded need to be handled differently. Thereby, the page buffer used to cope with unsuccessful page programs may be employed: the process for handling an exceeding of the effective program time can be combined with a process for handling an unsuccessful page program. Though, one major difference is that if a page program operation exceeds the effective program time (in this example it is 350 µs), it is the following page that needs to be buffered. Further, the input of the following page into the data register of the (still busy) NAND flash device has to be omitted. Consequently, the page is only stored into the page buffer. In the case of program failure however, it is the current page that needs to be buffered.

The following is an example:

If the $i^{th}$ page to be stored in NAND flash device k exceeds the effective program time of 350 µs, the (i+1)st page to be stored in the same NAND flash (device k) will only be stored in the page buffer. The input into the data register of NAND flash device k has to be omitted. The $(i+2)^{nd}$ page again can be stored into this NAND flash k, since now the original maximum page program time of 700 µs is over. This means either that the $i^{th}$ page is now stored in the flash array of device k, or its "Status Read" signal indicates an unsuccessful page program process. A page program operation exceeds the effective program time if the "Status Read" indicates that the page program operation is still ongoing after the effective program time is over. When the storage of the stream is completed, all the remaining pages in the page buffer will be stored in those NAND flash devices that have free storage capacity left. These devices may have to be determined, since the actual amount of stored data may vary, or it may be a reserved storage space in one or more of the flash devices.

The handling of those cases in which the program time is exceeded requires a page buffer that is large enough to store the corresponding pages. The measurements and calculations mentioned above show that the expected amount of data to be buffered in the page buffer can be estimated according to data page size, maximum amount of data to be stored (i.e. data stream length), and the probability for the employed flash device to exceed the selected effective program time, which depends on the selected effective program time. In other embodiments described above, also the storage failure probability of the employed flash is to be considered. As shown above, the effective program time can be selected such that the page buffer has a reasonable size, while the system still prevents loss of data. However, according to the invention the effective program time will be selected such that it is between the typical and the maximum program time (and usually closer to the typical than to the maximum program time) that are specified for the respective flash device.

The invention is especially advantageous when real-time constraints, i.e. a guaranteed data rate, have to be considered, e.g. storage of continuous, real-time data streams. The reduced effective program time reduces the minimum number of NAND flash devices which are necessary to achieve storage with the required data rate, while the proposed structure and mechanism prevents data loss.

Especially if guaranteed data rates are required, e.g. for applications with real-time constraints, the maximum program time has to be considered. Consequently, for scaling of storage architectures towards higher data rates the maximum program time determines the minimum number of flash devices required to achieve a specific, guaranteed data rate. This is particularly a limitation for storage systems with a smaller (restricted) form factor, as these systems typically have an upper limit for the number of flash devices they can contain. Furthermore, increasing the number of flash devices also means increasing the storage capacity of a system, thus causing higher costs.

The invention is not necessarily restricted to NAND flash devices, but it can also be used with other storage/memory devices that provide a similar program time distribution. It will be understood that the present invention has been described purely by way of example, and modifications of detail can be made without departing from the scope of the invention. Each feature disclosed in the description and (where appropriate) the claims and drawings may be provided independently or in any appropriate combination. Features may, where appropriate be implemented in hardware, software, or a combination of the two. Connections may, where applicable, be implemented as wireless connections or wired, not necessarily direct or dedicated connections.

What is claimed is:

1. Method for writing to a flash memory, wherein the flash memory has a specified maximum program time and a specified typical program time and provides one or more signals indicating if a programming cycle is finished, the method comprising the steps of
specifying an effective program time that is above typical program time and below maximum program time;
writing first data to the flash memory, wherein a programming cycle is associated with the writing;
after the specified effective program time, evaluating said one or more signals indicating if the programming cycle is finished;
if the programming cycle is finished, writing at least second data to the flash memory;
if the programming cycle is not finished, writing the at least second data to a buffer memory and marking the at least second data in the buffer memory not to be overwritten;
if further data are to be stored, repeating the previous steps starting from the step of writing the first data to the flash memory;
determining a free location in the flash memory; and
after said repeating the previous steps, copying the at least second data from the buffer memory to the determined location in the flash memory, wherein the at least second data may be erased from the buffer memory.

2. Method according to claim 1, wherein the flash memory is a NAND flash memory.

3. Method according to claim 1, wherein a data stream is written to the flash memory, and wherein the size of the buffer memory is equal to or above the total amount of data of said data stream for which a duration of the programming cycle is expected to exceed the effective program time.

4. Method according to claim 1, wherein the buffer memory is also used for storing data for which the step of writing first data to the flash memory failed.

5. Method according to claim 1, wherein a data stream is written to the flash memory, and wherein the size of the buffer memory is equal to or above the total amount of data of said data stream for which a duration of the programming cycle is expected to exceed the effective program time plus the expected amount of data of said data stream for which the step of writing first data to the flash memory will not be successful.

6. Method according to claim 1, wherein the effective program time is substantially 50% of the specified maximum program time.

7. Method according to claim 1, wherein the at least second data are marked with a mark that comprises sequence, position or timing information.

8. Device for writing input data to a flash memory, wherein the flash memory has a specified maximum program time and a specified typical program time and provides one or more signals indicating if a programming cycle is finished, the device comprising
means for specifying an effective program time that is above typical program time and below maximum program time;
means for writing first data of said input data to a first location in the flash memory, wherein a programming cycle is associated with the writing;
means for evaluating after the specified effective program time said one or more signals indicating if the programming cycle is finished;
means for writing at least second data of said input data to a second location in the flash memory, wherein the at least second data are only written into the flash memory if the previous programming cycle was finished;
a buffer memory;
means for writing the at least second data to the buffer memory;
means for notifying that the at least second data in the buffer memory may not be overwritten if the previous programming cycle was not finished;
means for determining a free location in the flash memory; and
means for copying the at least second data from the buffer memory to the determined location in the flash memory after a last data page of said input data has been stored in the flash, wherein the at least second data may be erased from the buffer memory.

9. Device according to claim 8, wherein said input data is a data stream, and the device is suitable for storing a data stream on the flash memory, and the size of the buffer memory is equal to or above the total amount of data of said data stream for which a duration of the programming cycle is expected to exceed the effective program time while said data stream is stored on the flash memory.

10. Device according to claim 8, wherein the buffer memory is also used for storing data of said input data for which the means for writing first data to the flash memory was not successful in writing first data to the flash memory.

11. Device according to claim 8, wherein the effective program time is substantially 50% of the specified maximum program time of the flash memory.

12. Device according to claim 8, wherein the at least second data are marked with a mark that comprises sequence, position or timing information.

* * * * *